(12) United States Patent
Shimizu et al.

(10) Patent No.: US 6,477,072 B2
(45) Date of Patent: *Nov. 5, 2002

(54) LAYOUT DESIGN METHOD ON SEMICONDUCTOR CHIP FOR AVOIDING DETOUR WIRING

(75) Inventors: Hiroshi Shimizu; Keizo Aoyama, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/412,986

(22) Filed: Oct. 6, 1999

(65) Prior Publication Data

US 2001/0014030 A1 Aug. 16, 2001

(30) Foreign Application Priority Data

Oct. 6, 1998 (JP) .......................... 10-284632

(51) Int. Cl.$^7$ ................................. G11C 5/02
(52) U.S. Cl. ......................... 365/51; 365/200
(58) Field of Search ................... 365/51, 200

(56) References Cited

U.S. PATENT DOCUMENTS

| 4,888,631 | A | | 12/1989 | Azumua et al. | ........... | 357/23.6 |
|---|---|---|---|---|---|---|
| 5,208,782 | A | * | 5/1993 | Sakuta et al. | .......... | 365/230.03 |
| 5,519,658 | A | * | 5/1996 | Uda et al. | .................... | 365/200 |
| 5,877,992 | A | * | 3/1999 | Wu et al. | .................... | 365/200 |

FOREIGN PATENT DOCUMENTS

| JP | 0203475 | * | 8/1990 | ........... G11B/20/14 |
|---|---|---|---|---|
| JP | 10124868 A | | 5/1998 | |

OTHER PUBLICATIONS

Betty Prince, "Semiconductor Memories", 1983, Wiley, 2$^{nd}$ pp. 325–327.*

* cited by examiner

Primary Examiner—M. Tran
(74) Attorney, Agent, or Firm—Arent Fox Kintner Plotkin & Kahn

(57) ABSTRACT

In the peripheral area of a semiconductor chip 10A, there is arranged a macro cell 51 which comprises a fuse circuit having a plurality of fuse circuit units, each of which has a fuse and outputs a signal indicating whether or not the fuse is cut off, and a predecoder receiving the outputs of the fuse circuit. In the interior of the chip 10A, there is arranged a macro cell 41 which comprises a main decoder 33 receiving the outputs of the predecoder, a signal conversion circuit 34 for converting the outputs of the main decoder 33 to generate a conversion signal, and a memory circuit 20. The memory circuit 20 comprises a plurality of normal memory blocks and a redundant memory block with the same configuration to each other, and a switching circuit for, in response to the conversion signal, making a defect one of the normal memory blocks out of use with making the redundant memory block in use.

19 Claims, 12 Drawing Sheets

: POWER SUPPLY WIRING AREA

: MACRO CELL HAVING FUSE CIRCUIT

US 6,477,072 B2

LAYOUT DESIGN METHOD ON SEMICONDUCTOR CHIP FOR AVOIDING DETOUR WIRING

BACKGROUND OF THE INVENTION

1. Field of the Invention

The present invention relates to a layout design method on a semiconductor chip for avoiding detour wiring and a semiconductor device produced with applying the same.

2. Description of the Related Art

FIG. 10 is a schematic block diagram of ASIC in which macro cells 11 to 14 with the same configuration to each other are arranged on a semiconductor chip according to a user's request.

A macro cell 11 is an SRAM, as shown in FIG.11, comprising a memory circuit 20 and a defect-repairing control circuit 30. The memory circuit 20 is provided with a switching circuit 201, memory blocks 2-1 to 2-36 and a redundant memory block 2-37. The memory blocks 2-1 to 2-37 have the same configuration to each other and a capacity of each block is, for example, 4 k bit.

A read/write test is performed on the memory circuit 20 prior to shipment of a semiconductor chip 10 and, for example, when it is detected that a memory cell indicated by an X mark in the memory block 2-2 is defective, the memory blocks 2-1 and 2-3 to 2-37 are in use, excluding the memory block 2-2. That is, wiring of data input/output ends of memory blocks are shifted in units of a block by a switching circuits 201, so that the memory blocks 2-1 and 2-3 to 2-37 go into use, instead of the memory blocks 2-1 to 2-36.

The defect-repairing control circuit 30 comprises circuits 31 to 34 in order that the defect-repairing control circuit 30 provides switching signals to the switching circuit 201 depending on a location of a defective memory block and makes the switching circuit 201 perform connection switching.

A location of a defective memory block is designated by cutting off a fuse in a fuse circuit 31 by irradiating it with laser beam. Since a fuse is relatively large in size, coded outputs of the fuse circuit 31 are used in order to decrease the number of fuses. The outputs are decoded in a predecoder 32 and a main decoder 33 and outputs of a signal conversion circuit 34 are provided to the switching circuit 201.

Since wiring cannot be laid in an upper layer of the fuse circuit 31, when wiring of signal and power is designed on a user side, as shown in FIG. 12, wiring has to be laid with making a detour around the defect-repairing control circuit 30 whose majority area is the fuse circuit. Hence, there arise problems that not only an area for the wiring increases due to increase in length of the wiring, but also a signal propagation delay time becomes longer. These problems also arise in the case where a different element, instead of a fuse, whose upper layer wiring is prohibited is used.

SUMMARY OF THE INVENTION

Accordingly, it is an object according to the present invention to provide a layout design method on a semiconductor chip in which detour wiring can be reduced or absent, and a semiconductor device produced with applying the same.

In the present invention, there is provided a semiconductor device wherein an element over which wiring is prohibited to be laid is arranged in a peripheral area of a semiconductor chip or a functional block on the semiconductor chip.

With the present invention, detour wiring around the element over which wiring is prohibited is reduced or absent and thereby, not only an area for the wiring can be reduced due to suppression of increase in length of wiring but a signal propagation delay time can also be shortened.

Other aspects, objects, and the advantages of the present invention will become apparent from the following detailed description taken in connection with the accompanying drawings.

DESCRIPTION OF THE PREFERRED EMBODIMENTS

Figure 1:
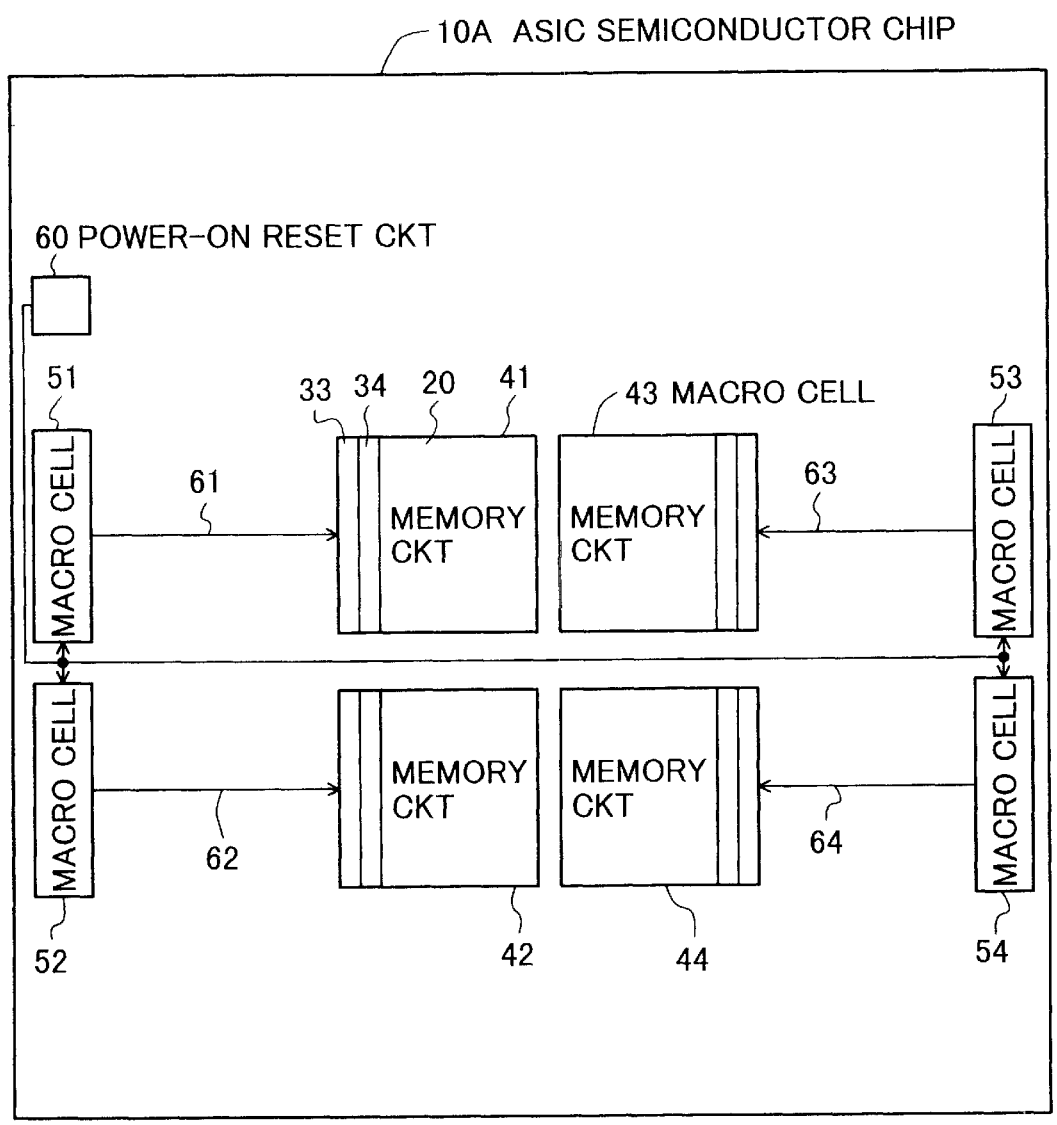
FIG. 1 is a schematic block diagram showing an ASIC semiconductor chip of a first embodiments according to the present invention.

Referring now to the drawings, wherein like reference characters designate like or corresponding parts throughout several views, preferred embodiments of the present invention are described below.

It should be noted that the use of the terms "connected" and "coupled" indicates an electrical connection between two elements and can include an intervening element between the two "coupled" or "connected" elements.

First Embodiment

Figure 10:
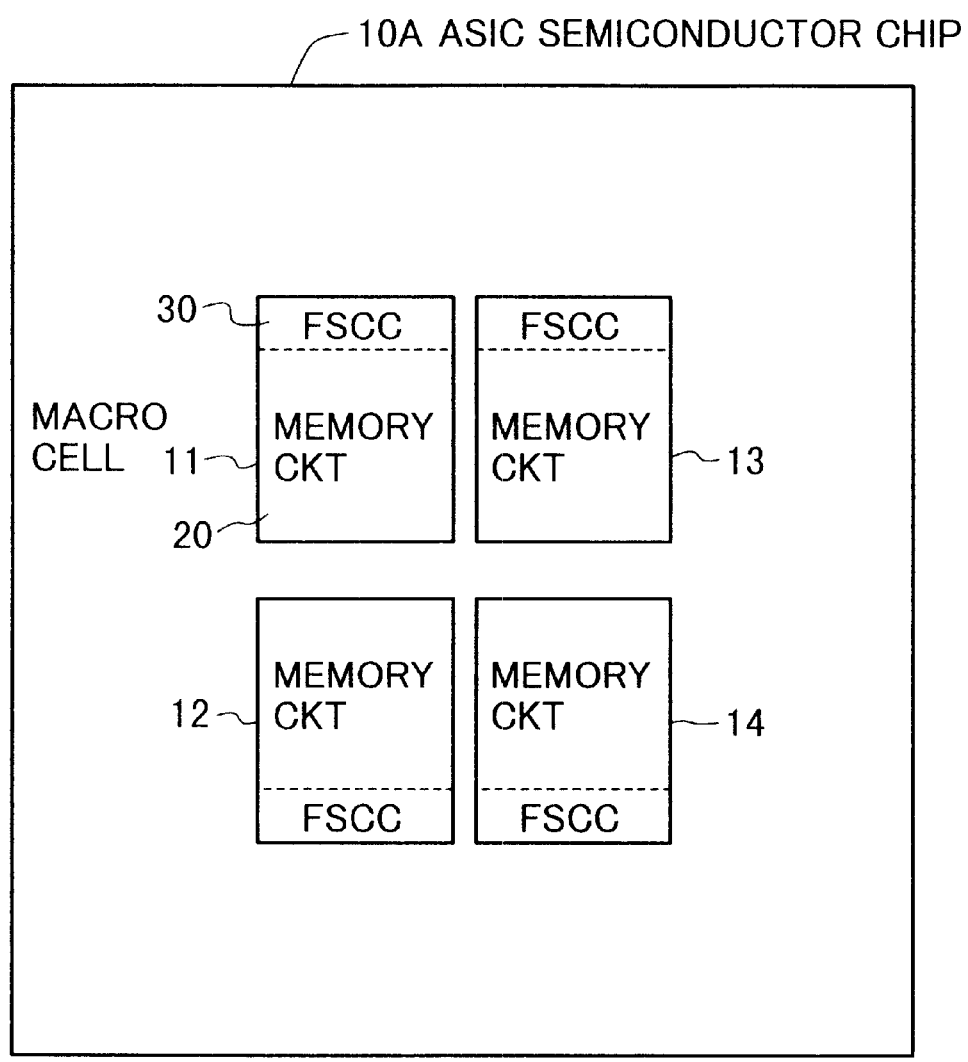
FIG. 10 is a schematic block diagram showing a prior art ASIC semiconductor chip on which SRAM macro cells each with a defect-repairing control circuit including fuses are arranged.

FIG. 1 is a schematic block diagram showing a semiconductor chip 10A provided with the same functions as those of a semiconductor chip 10 of FIG. 10.

On the semiconductor chip 10A, macro cells 41 to 44 with the same configuration to each other and macro cells 51 to 54 with the same configuration to each other respectively corresponding to the macro cells 41 to 44 are arranged. The macro cells 51 to 54 each are a defect location signal generating circuit including fuses which occupies a majority of an area thereof and arranged in the peripheral area of the semiconductor chip 10A. The macro cells 41 to 44 are respectively circuits left after the macro cells 51 to 54 are eliminated from macro cells 11 to 14 of FIG. 10 and arranged in the interior of the semiconductor chip 10A.

Further, on the chip 10A, a macro cell of a power-on reset circuit 60 is arranged and provides a timing signal, for setting defective memory block location data, to the defect location signal generating circuits 51 to 54.

For example, the macro cells each are standard cells and registered in a cell library.

The macro cells 41 to 44 are respectively connected to the defect location signal generating circuits 51 to 54 with wiring 61 to 64.

Figure 2:
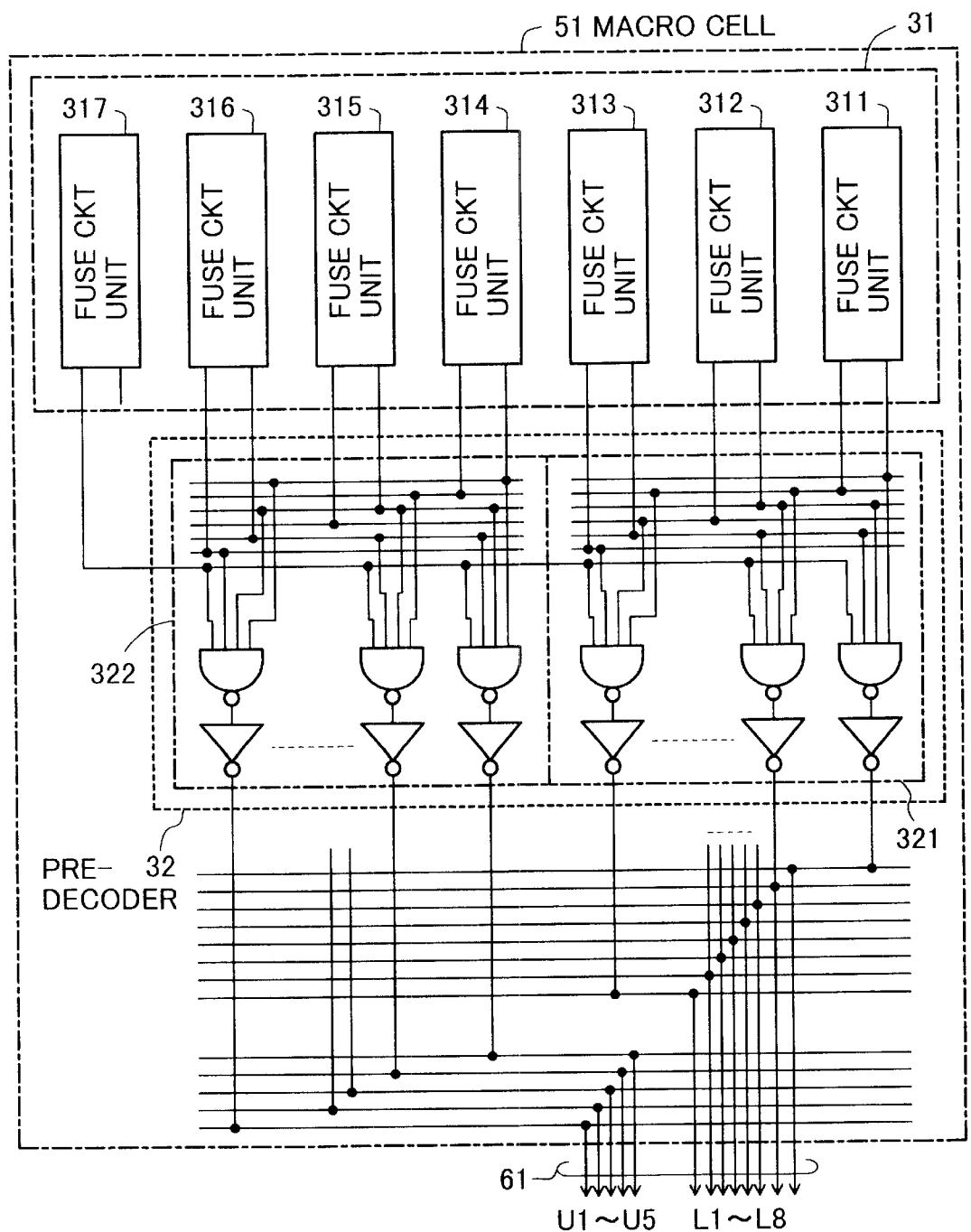
FIG. 2 is a diagram showing a configuration of a defect location signal generating circuit which is a macro cell in FIG. 1.

FIG. 2 is a diagram showing a configuration of the defect location signal generating circuit 51 which is a macro cell in FIG. 1. The circuit 51 comprises a fuse circuit 31 for setting defective-memory-block location data and a predecoder 32 to which outputs of the circuit 31 are provided. The fuse circuit 31 comprises fuse circuit units 311 to 317 each with the same configuration to each other. The unit 311 outputs, after power-on reset, a pair of complementary signals indicating whether or not a fuse in the unit is cut off.

Figure 3:
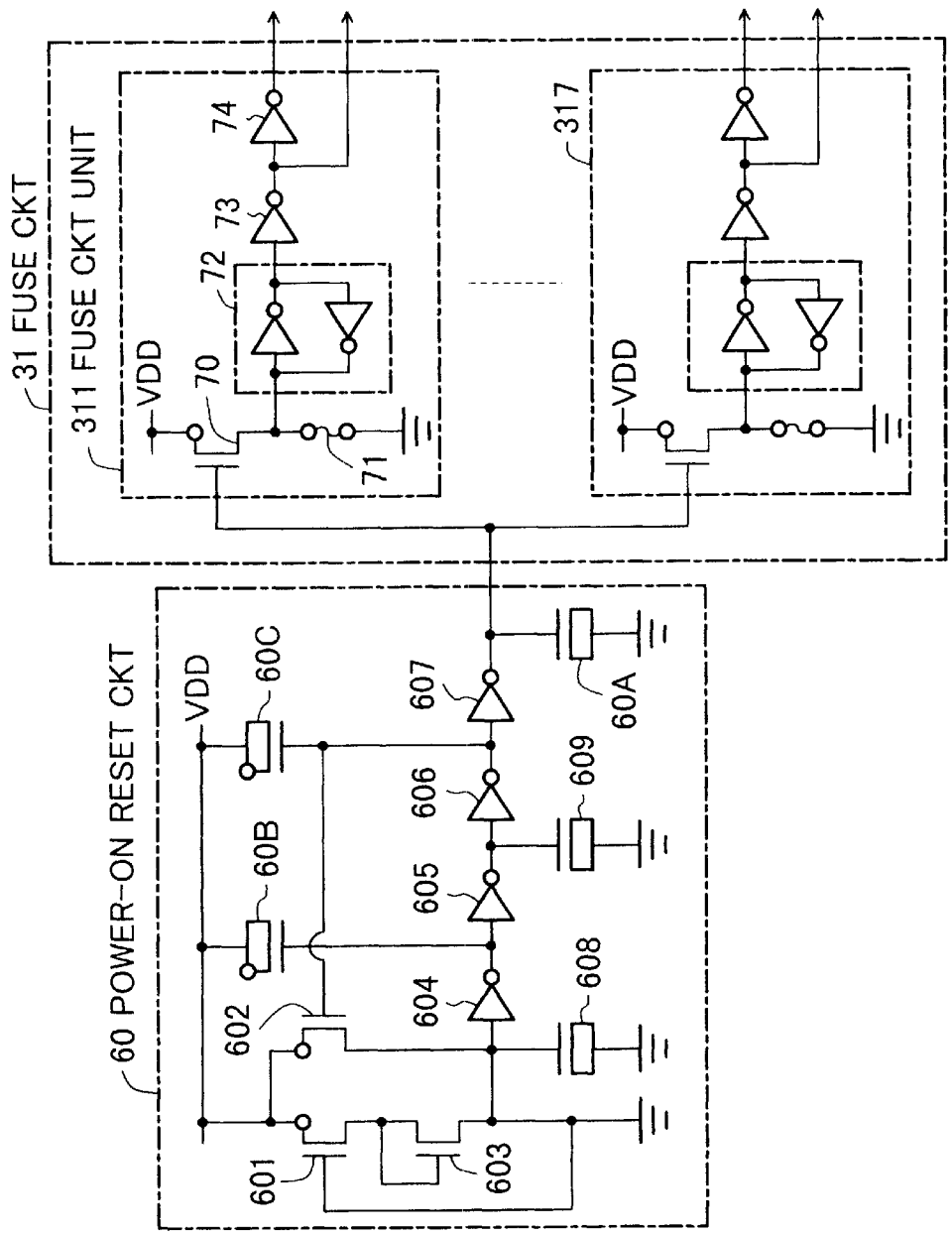
FIG. 3 is a diagram showing configurations of a power on reset circuit, and a fuse circuit in the defect location signal generating circuit in FIG. 1.

FIG. 3 shows configurations of the fuse circuit 31 and the power-on reset circuit 60.

In the circuit 60, 601 and 602 are PMOS transistors, 603 is an NMOS transistor, 604 to 607 are inverters, 608, 609 and 60A are NMOS capacitors, 60B and 60C are PMOS capacitors, and VDD is a power supply potential.

With the configuration, when a power supply is on and the power supply potential VDD is raised to a predetermined value, an output of the inverter 607 transits from low to high.

In the fuse circuit unite 311, 70 is a PMOS transistor, 71 is a fuse, 72 is a flip-flop in which two inverters are in loop connection, and 73 and 74 are inverters for buffer and inversion of a signal level.

The PMOS transistor 70 is on just before the output of the inverter 607 changes to high. In this state, since the on-resistance of the transistor 70 is larger than a resistance of the fuse 71, if the fuse 71 is not cut off, the input and output of the flip-flop 72 are low and high, respectively, and the input and output of the inverter 74 are low and high, respectively. Conversely, if the fuse 71 is cut off, the input and output of the inverter 74 are high and low, respectively.

When the output of the inverter 607 goes high, the transistor 70 becomes off and therefore, a current is prevented from flowing through the transistor 70 and the fuse 71 when the fuse 71 is not cut off, with keeping the state of the flip-flop 72.

Referring back to FIG. 2, the predecoder 32 comprises 3 bit decoders 321 and 333 each including NAND gates and inverters. The decoder 321 decodes all outputs 0 to 7 of the fuse circuit units 311 to 313, and the decoder 322 decodes outputs 0 to 4 of the fuse circuit units 314 to 316.

An output of the unit 317 is provided to the decoders 321 and 322. When a fuse of the unit 317 is not cut off, since the output of the unit 317 is low, all the outputs of the predecoder 32 are low regardless of outputs of the units 311 to 316. When the fuse of the unit 317 is cut off, only one of outputs of the predecoder 321 depending on outputs of the fuse circuit units 311 to 313 is high and only one of outputs of the predecoder 322 depending on the fuse circuit units 314 to 316 is high.

Outputs of the predecoder 32 are provided to the macro cell 41 of FIG. 1 through the wiring 61 (U1 to U5 and L1 to L8).

Figure 4:
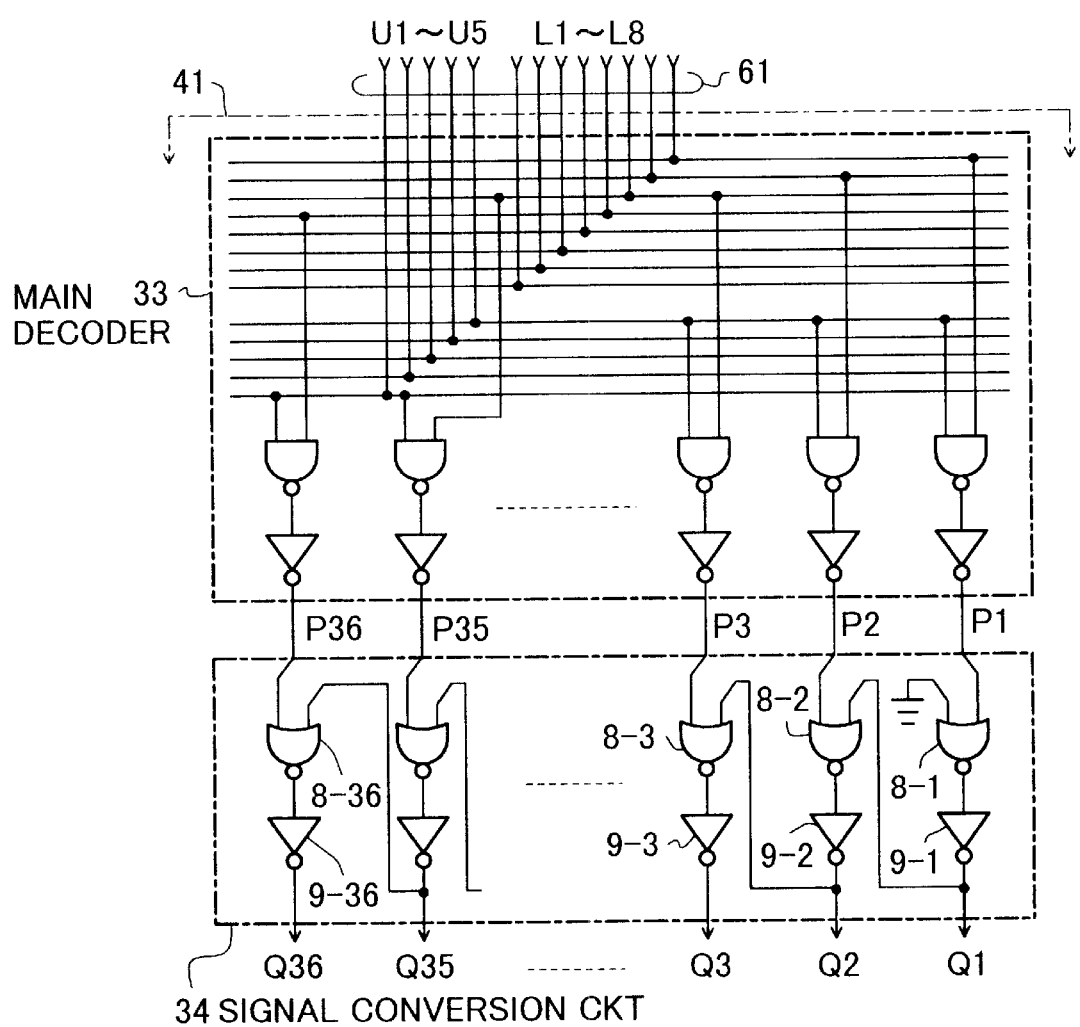
FIG. 4 is a diagram showing a configuration of a circuit in an SRAM macro cell associated with the circuit of FIG. 2.

Configurations of a main decoder 33 and a signal conversion circuit 34 in the macro cell 41 are shown in FIG. 4.

The wiring 61 are connected to the inputs of the main decoder 33. The main decoder 33 comprises 36 circuits in each of which a NAND gate and an inverter are cascaded and an output of each inverter is high when a specific one output of the 3 bit decoder 321 and a specific one output of the 3 bit decoder 322 are high. Depending on outputs of the fuse circuit 31, one of output signals P1 to P36 of the main decoder 33 is high while the others are low.

In the signal conversion circuit 34, inverters 9-1 to 9-36 are respectively connected to outputs of NOR gates 8-1 to 8-36. Output signals P1 to P36 of the main decoder 33 are provided to one inputs of the NOR gates 8-1 to 8-36, respectively. The other input of the NOR gate 8-1 is fixed low. Outputs of the inverters 9-1 to 9-35 are provided to the other inputs of the NOR gates 8-2 to 8-36, respectively. From the inverters 9-1 to 9-36, memory block switching signals Q1 to Q36 are outputted, respectively.

In the above described configurations, if no defective memory cell is present in the memory circuit 20, no fuse in the fuse circuit 31 is cut off and output signals Q1 to Q36 of the signal conversion circuit 34 are all low in response to power-on. That is, connection switching is not changed over and the memory blocks 2-1 to 2-36 are in use while the redundant memory block 37 is out of use.

Figure 11:
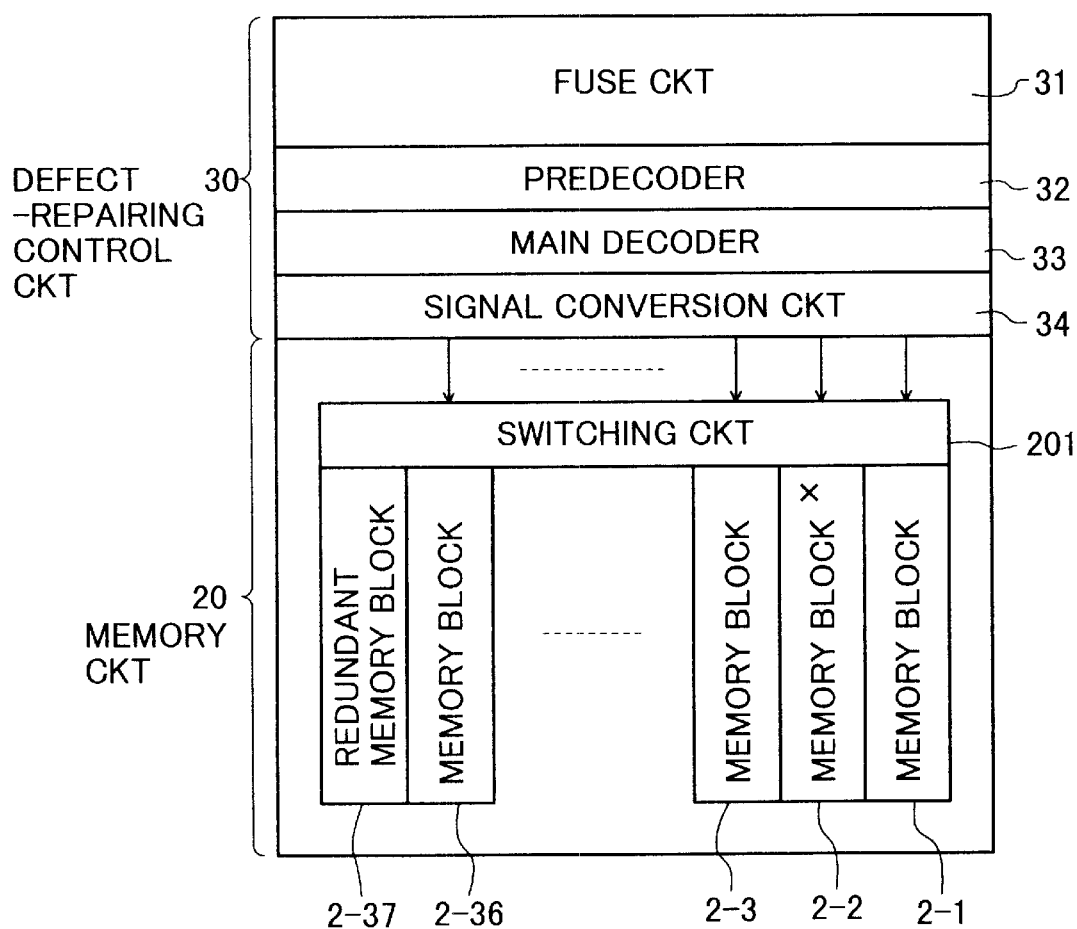
FIG. 11 is a block diagram showing a schematic configuration of the prior art SRAM macro cell with a defect-repairing control circuit in FIG. 10.

When a defective memory cell is present in a memory block 2-i (i is one of 1 to 36) of the memory circuit 20 shown in FIG. 11, some fuses in the fuse circuit 31 are cut off by irradiation of laser beam, so that the fuse circuit 31 outputs a value i and the fuse of the unit 317 is also cut off by the laser beam. In response to power-on, the fuse circuit 31 outputs the value i and an output signal Pi of the main decoder 33 goes high while the others of the output signals P1 to P36 go low. With such operations, output signals Q1 to Q(i−1) of the signal conversion circuit 34 go low while signals Qi to Q36 go high. In response to such outputs, the conversion circuit 201 (see FIG. 11) in the memory circuit 20 shifts connection destination of data input/output of each memory block, in units of a block, so as to place a memory block 2-i out of use. With such a shift, memory blocks 2-(i+1) to 2-37 are in use instead of memory blocks 2-i to 2-36, respectively.

Wiring in upper layer over the area including fuses and the neighborhood thereof is prohibited in order to avoid any influence on the area by laser beam irradiation, and such prohibition applies to the other memory circuits.

Figure 5:
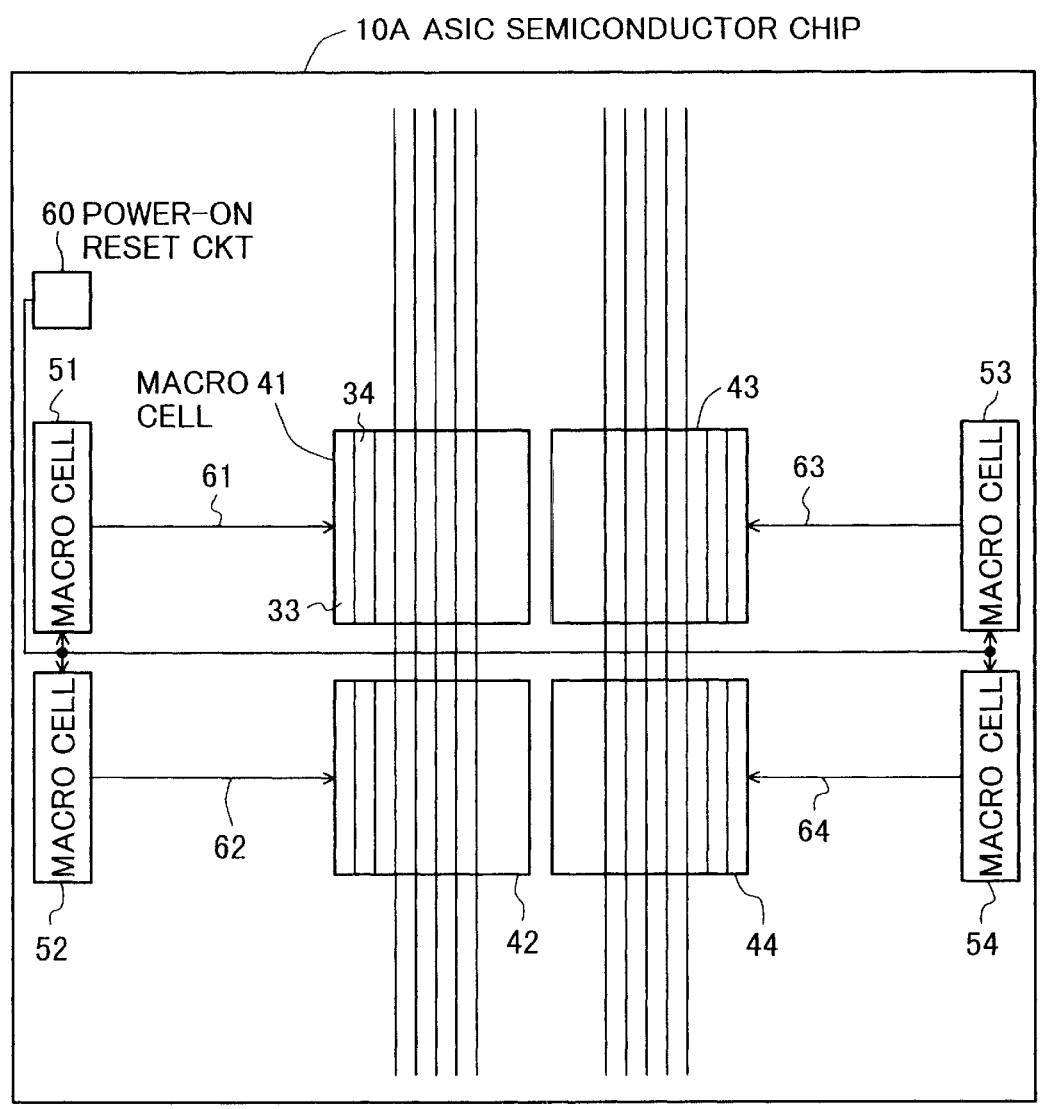
FIG. 5 is a diagram showing part of wiring formed on the semiconductor chip of FIG. 1.
Figure 12:
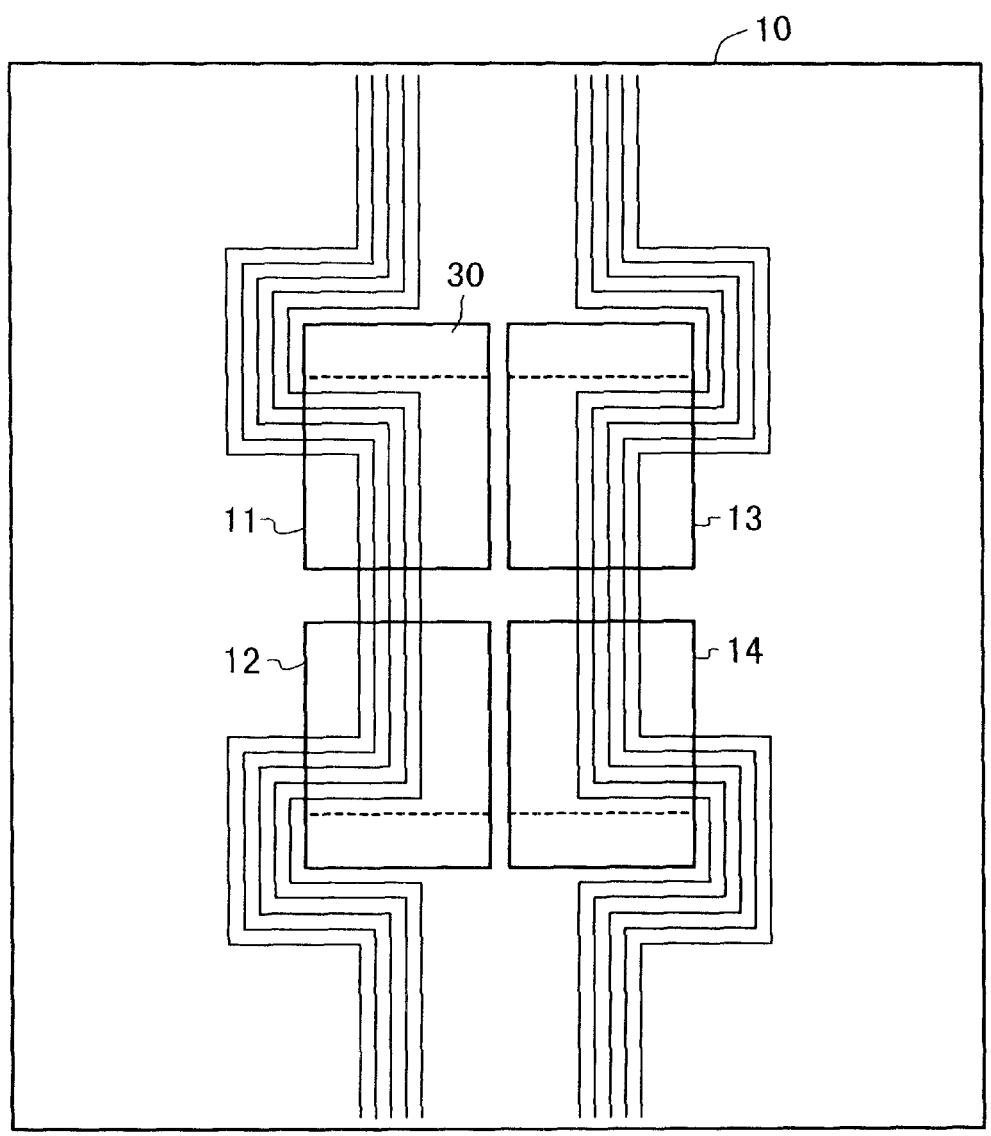
FIG. 12 is a diagram showing part of prior art wiring formed on the semiconductor chip of FIG. 10.

Since the defect location signal generating circuits 51 to 54 are arranged in the peripheral area on the chip 10A, prior art wiring, as shown in FIG. 12, which are designed by a user are modified into a pattern of configuration as shown in FIG. 5, according to the first embodiment, so that detour wiring around the circuits 51 to 54, a majority of whose area is occupied by the fuses, is absent. With the elimination of the detour wiring, not only wiring area can be reduced due to suppressed increase in wiring length, but a signal propagation delay time can also be shortened.

In FIG. 2, since the number of outputs of the fuse circuit 31 is the same as the number of outputs of the predecoder 32, which is 13, but less than the number of outputs of the main decoder 33 of FIG. 4, which is 36, the number of the wiring 61 can be reduced. Further, the predecoder 32 can be made to function as a driving power amplifier by arranging the predecoder 32 in the side of the fuse circuit 31.

Figure 6:
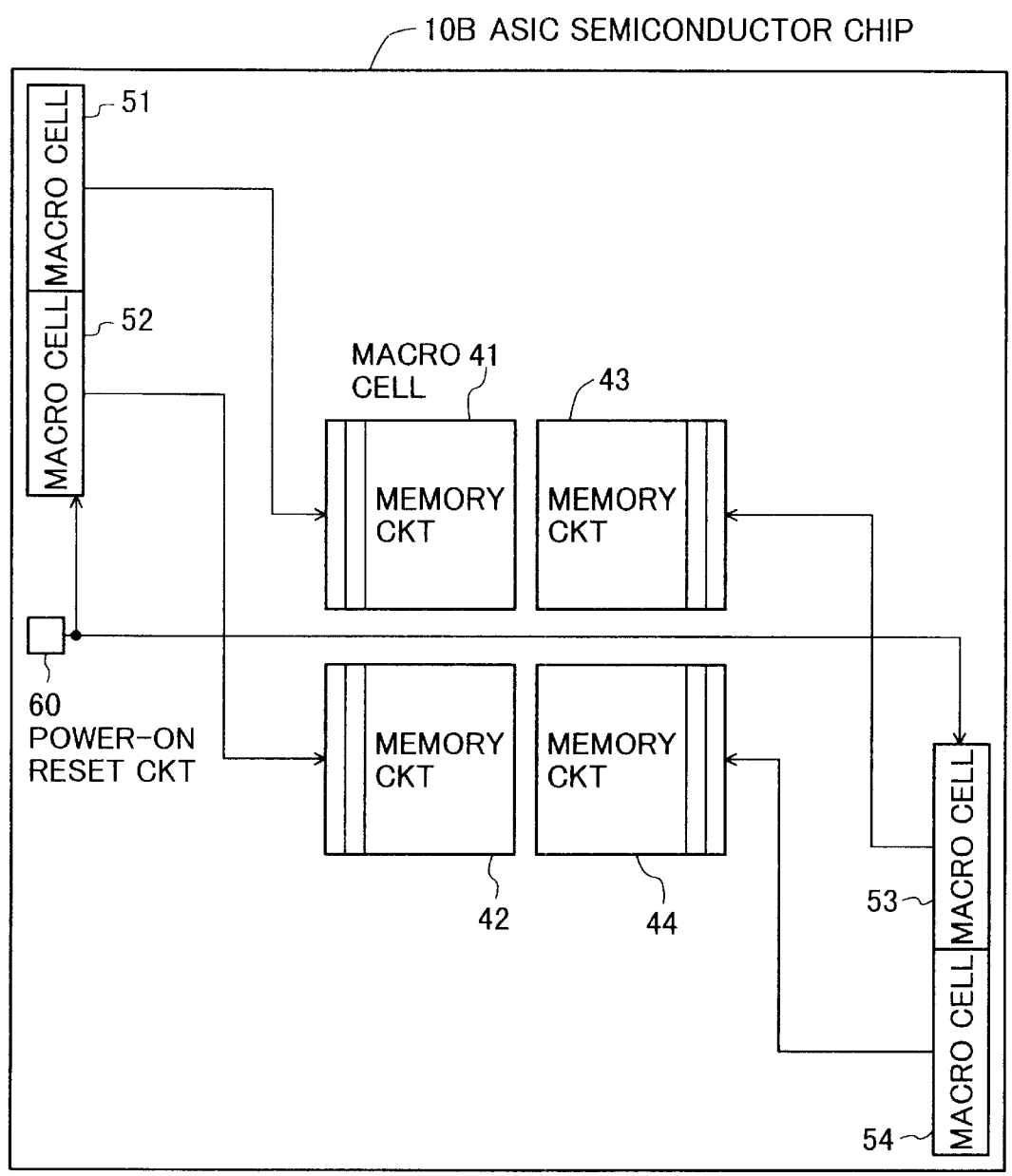
FIG. 6 is a schematic block diagram showing a modified embodiment of the ASIC semiconductor chip of FIG. 1.

FIG. 6 is a schematic block diagram showing a chip 10B as a modification of the first embodiment. In the chip 10B, the defect location signal generating circuits 51 and 52 which are both macro cells are arranged in series on a corner of the chip 10B, and the defect location signal generating circuits 53 and 54 which are both macro cells are also arranged in series on another corner of the chip 10B. In such a configuration, there is a possibility to decrease detour wiring in the peripheral area of the chip 10B as well, though according to a case.

The other points are the same as those of FIG. 1.

Figure 7:
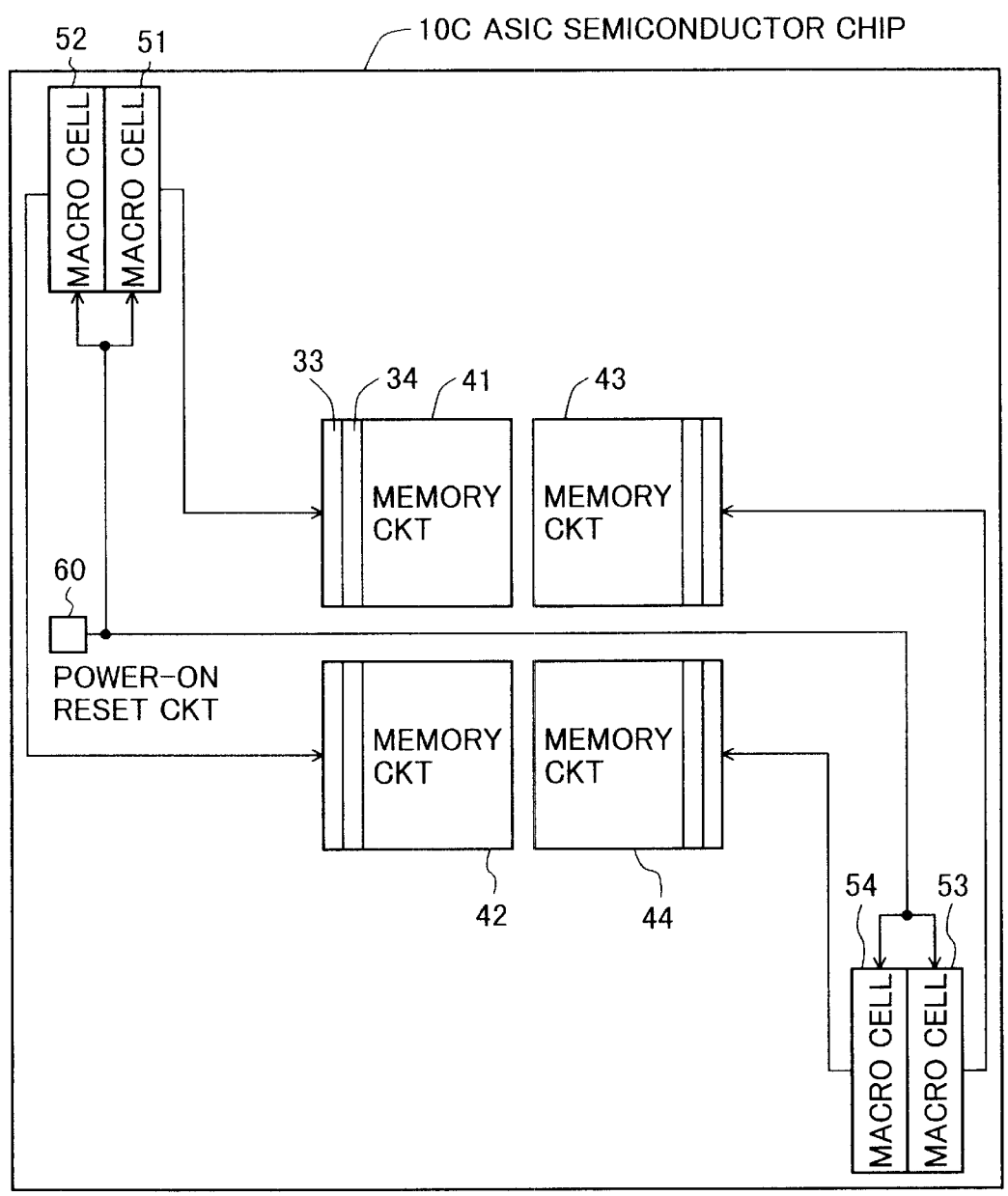
FIG. 7 is a schematic block diagram showing another modified embodiment of the ASIC semiconductor chip of FIG. 1.

FIG. 7 shows an another modification of the first embodiment. In a chip 10C, the defect location signal generating circuits 51 and 52 which are both macro cells are arranged in parallel on a corner and the defect location signal generating circuits 53 and 54 which are both macro cells are also arranged in parallel on another corner.

Second Embodiment

Figure 8:
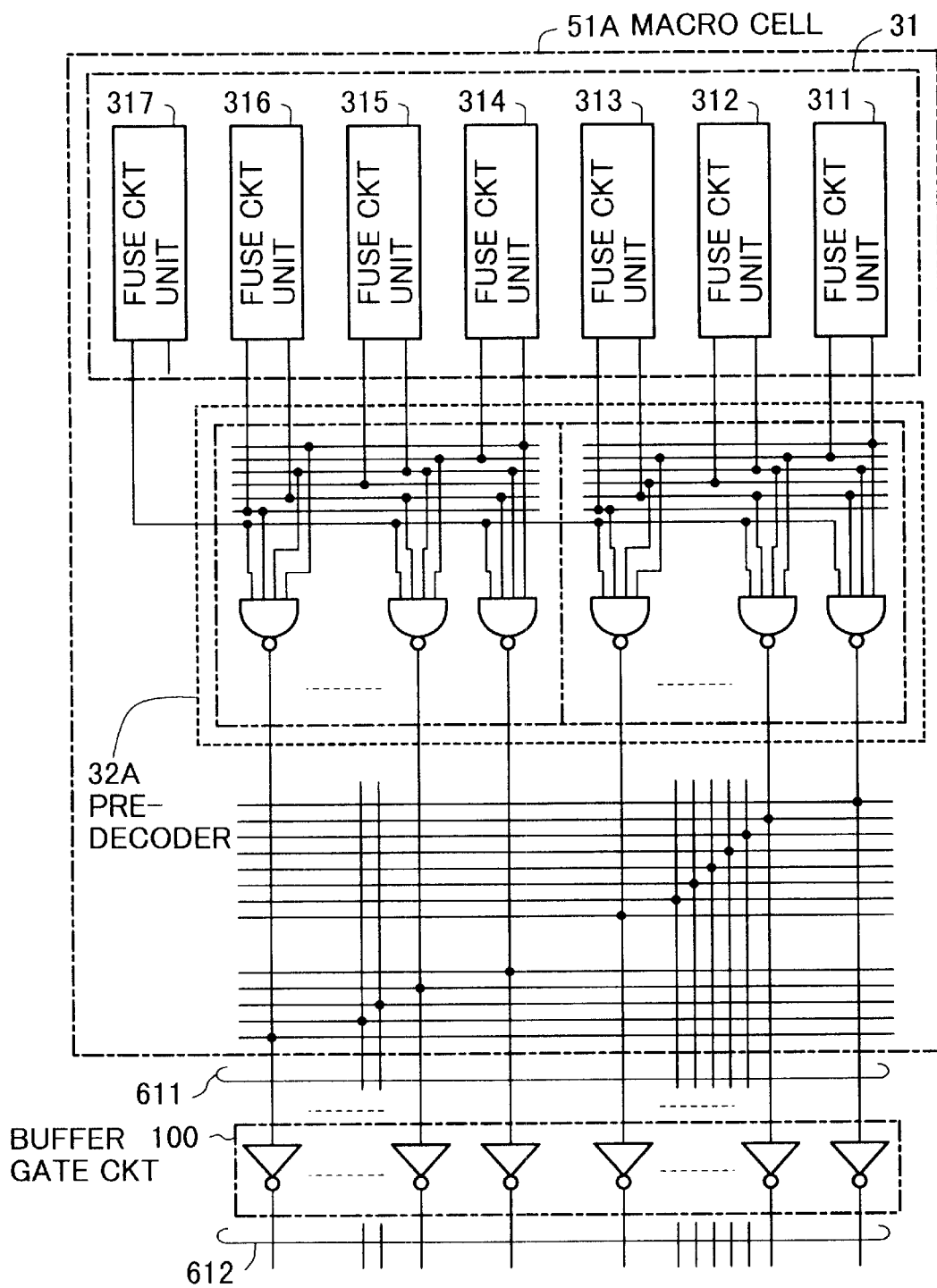
FIG. 8 is a diagram showing a circuit corresponding to FIG. 2, which is arranged on an ASIC semiconductor chip of a second embodiment according to the present invention.

FIG. 8 is a diagram showing a circuit corresponding to FIG. 2, which is arranged on an ASIC semiconductor chip of a second embodiment according to the present invention. In the circuit, the predecoder 32 in FIG. 2 is divided into a predecoder 32A and a buffer gate circuit 100, the wiring 61 in FIG. 1 is divided into two groups 611 and 612, and the circuit 100 is arranged therebetween.

The other points are the same as those of the first embodiment.

According to the second embodiment, when wiring between the macro cells 51A and 41 are comparatively long, signal rounding is prevented by the buffer gate circuit 100.

Third Embodiment

Figure 9:
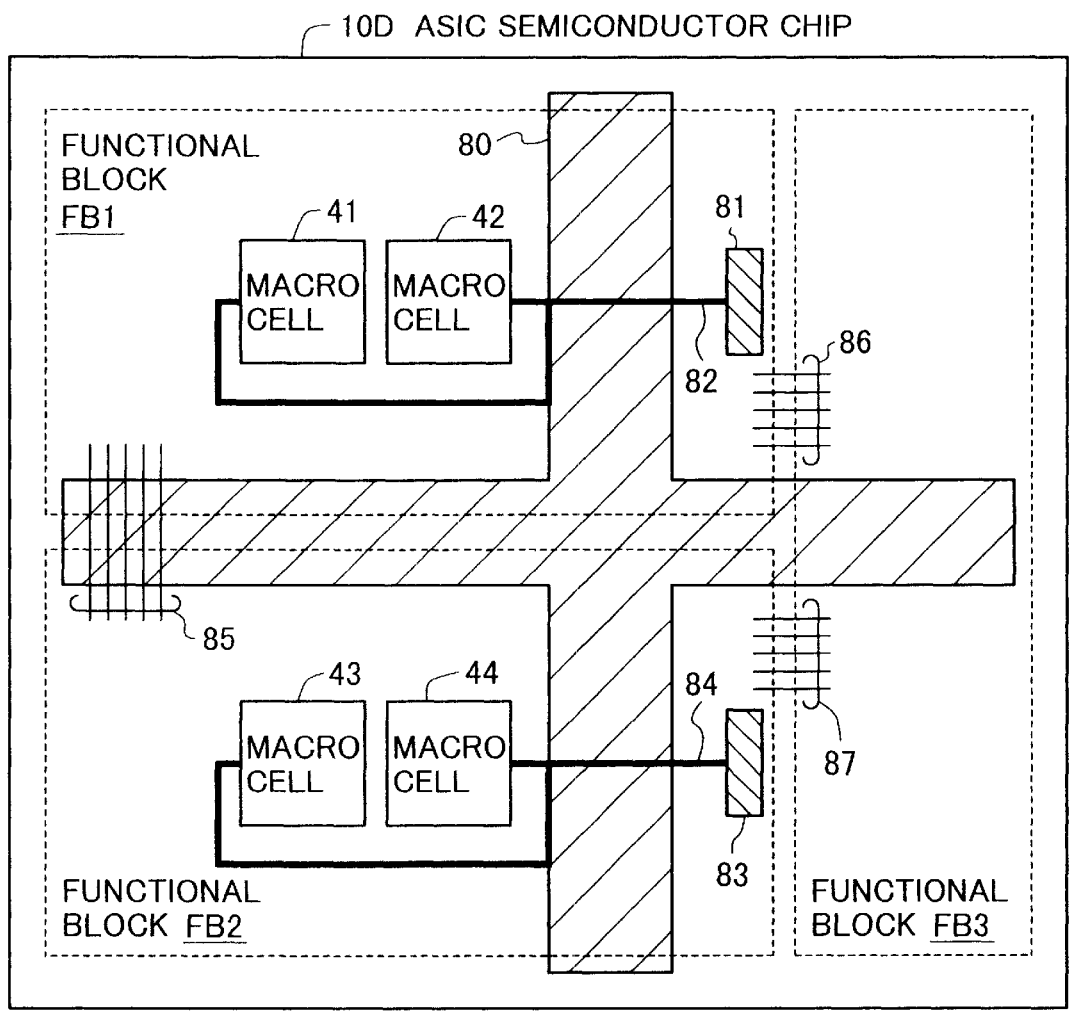
FIG. 9 is a schematic block diagram of a circuit on an ASIC semiconductor chip of a third embodiment according to the present invention.
Figure 9:
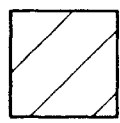
Figure 9:

FIG. 9 is a schematic block diagram of a circuit on an ASIC semiconductor chip of a third embodiment according to the present invention.

In the circuit, functional blocks FB1 to FB3 are arranged on the chip 10D. A power supply wiring area 80 extends over the functional blocks FB1 to FB3.

In the functional block FB1, macro cells 41, 42 and 81 are arranged. The macro cell 81 comprises the macro cells 51 and 52 of FIG. 1, and is arranged in the peripheral area of the functional block FB1. The macro cells 41 and 42 are separated from the macro cell 81 with the power supply wiring area 80 interposed therebetween. Wiring 82 are composed of the wiring 61 and 62 of FIG. 1. In regard to separation between the macro cells 41 and 42, and the macro cell 81, the macro cell 81 may include only a fuse circuit.

In a similar manner, in the functional block FB2, macro cells 43, 44 and 83 are arranged. The macro cell 83 comprises the macro cells 53 and 54 of FIG. 1, and is arranged in the peripheral area of the functional block FB2. The macro cells 43 and 44 are separated from the macro cell 83 with the power supply wiring area 80 interposed therebetween. Wiring 84 are composed of the wiring 63 and 64 of FIG. 1. In regard to separation between the macro cells 43 and 44, and the macro cell 83, the macro cell 83 may include only a fuse circuit.

The functional blocks are connected to each other through wiring 85 to 87. Coupling between the functional blocks FB1 and FB3 is comparatively weak and the number of lines therebetween is so small that the lines are not required to make a detour around the macro cell 81 including a fuse circuit. In a similar manner, coupling between the functional blocks FB2 and FB3 is comparatively weak and the number of lines therebetween is so small that the lines are not required to make a detour around the macro cell 83 including a fuse circuit.

In the third embodiment, since macro cells each including a fuse circuit are respectively arranged in the peripheral areas of functional blocks, wiring in each functional block is not required to make a detour around the macro cell including a fuse circuit.

Although preferred embodiments of the present invention has been described, it is to be understood that the invention is not limited thereto and that various changes and modifications may be made without departing from the spirit and scope of the invention.

For example, the present invention can be applied to a case where in stead of a fuse, a different element in an upper layer over which wiring is prohibited (for example, an element whose characteristic changes on irradiation with laser beam) is used.

The buffer gate 100 in FIG. 8 may be provided at an input stage of the main decoder in FIG. 4.

Further, the signal conversion circuit 34 in FIG. 4 may have a configuration to perform a different conversion depending on a configuration of a switching circuit.

Besides, circuits which are controlled to be switched over based on the conversion signals Q1 to Q36 are not limited to SRAMs, but may be circuits having repeated circuit arrangement.

It is needless to say that a chip may not be an ASIC.

What is claimed is:

1. A semiconductor device comprising:
   a semiconductor chip having a peripheral area, and an element over which wiring is prohibited to be laid, wherein the element over which wiring is prohibited to be laid is positioned in the peripheral area of the semiconductor chip, and said element is for writing information;
   a first macro cell arranged in an interior area of a semiconductor or a functional block on said semiconductor chip, wherein the first macro cell includes:
      a plurality of first circuits each having a same configuration;
      a redundant circuit having the same configuration as said first circuit; and
      a switching circuit for, in response to a switching signal, making one of said first circuits containing a defect out of use with making said redundant circuit in use.

2. A semiconductor device according to claim 1, wherein said element includes a fuse circuit.

3. A semiconductor device according to claim 1, wherein said element includes a fuse circuit.

4. A semiconductor device according to claim 1, wherein a second macro cell is interconnected through wiring to said first macro cell.

5. A semiconductor device comprising:
   a first macro cell arranged in an interior area of a semiconductor chip or a functional block on said semiconductor chip; and
   a second macro cell arranged in a peripheral area or a functional block on said semiconductor chip, said second macro cell including an element over which wiring is prohibited to be laid;
   wherein said element is for writing information,
      wherein said first macro cell includes:
         a plurality of first circuits each having a same configuration;
         a redundant circuit having the same configuration as said first circuit; and a switching circuit for, in response to a switching signal, making one of said first circuits containing a defect out of use with making said redundant circuit in use, and wherein said second macro cell includes a second circuit having said element, said second circuit being for outputting a signal depending on written information in said element as a signal related to said switching signal.

6. A semiconductor device according to claim 5, wherein said second circuit comprises:
  a fuse circuit including a plurality of fuse circuit units, each fuse circuit unit including a fuse as said element and providing a signal for indicating whether or not said fuse is cut off; and
  a predecoder having sub decoders which respectively decodes a plurality of groups of outputs of said fuse circuit,
    wherein said first macro cell further comprises:
      a main decoder for finally decoding outputs of said sub decoders; and
      a signal conversion circuit for converting output signal of said main decoder to generate said switching signal.

7. A semiconductor device according to claim 6, further comprises a driving cell inserted in interconnecting wiring between said first macro cell and said second macro cell.

8. A semiconductor device according to claim 7, wherein said driving cell is an inverter.

9. A semiconductor device according to claim 5, wherein said second circuit comprises a fuse circuit including a plurality of fuse circuit units, each fuse circuit unit including a fuse as said element and providing a signal for indicating whether or not said fuse is cut off, and
  wherein said first macro cell further comprises:
    a predecoder having sub decoders which respectively decodes a plurality of groups of outputs of said fuse circuit;
    a main decoder for finally decoding outputs of said sub decoders; and
    a signal conversion circuit for converting output signal of said main decoder to generate said switching signal.

10. A semiconductor device according to claim 5, further comprising a power-on resetting cell, for providing a timing signal to define said output of said fuse circuit, arranged on said semiconductor chip,
  wherein said fuse circuit unit further comprises:
    an FET having a gate electrode for receiving said timing signal, and having a drain; and
    a flip-flop having an input coupled to said drain, wherein said fuse is coupled to said drain in series.

11. A semiconductor device according to claim 6,
wherein said fuse circuit further comprises a fuse circuit unit having an output for providing a signal to disable said output of said fuse circuit so as to make said redundant circuit out of use.

12. A semiconductor device according to claim 5, wherein said first circuits are memory blocks in a SRAM.

13. A semiconductor device according to claim 5, wherein said second macro cell is arranged in a corner on said semiconductor chip.

14. A semiconductor device according to claim 5, wherein a plurality pair of said first and second macro cells are arranged on said semiconductor chip, and said second macro cells are arranged in parallel.

15. A semiconductor device according to claim 5, wherein a plurality pair of said first and second macro cells are arranged on said semiconductor chip, and said second macro cells are arranged in series.

16. A layout design method on a semiconductor chip for producing said semiconductor chip, comprising the steps of:
  arranging a first macro cell in an interior of said semiconductor chip of a functional block on said semiconductor chip, wherein the first macro cell includes:
    a plurality of first circuits each having a same configuration;
    a redundant circuit having the same configuration as said first circuit; and
    a switching circuit for, in response to a switching signal, making one of said first circuit containing a defect out of use with making said redundant circuit in use; and
  arranging a second macro cell in a peripheral area of said semiconductor chip or said functional area, said second macro cell being interconnected through wiring to said first macro cell, said second macro cell having an element over which wiring is prohibited to be laid, said second macro cell being separated from said first macro cell.

17. A layout design method according to claim 16, wherein said first and second macro cells each are standard cells.

18. A layout design method according to claim 16, wherein said semiconductor chip is an ASIC.

19. A layout design method according to claim 16, wherein said second macro cell is interconnected through wiring to said first macro cell.

* * * * *